(12) United States Patent
Cook et al.

(10) Patent No.: US 6,455,766 B1
(45) Date of Patent: Sep. 24, 2002

(54) CONTACT-LESS PROBE OF SEMICONDUCTOR WAFERS

(75) Inventors: Donald J. Cook; Edward J. Nowak; Minh H. Tong, all of Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/829,946

(22) Filed: Apr. 11, 2001

Related U.S. Application Data

(62) Division of application No. 09/175,303, filed on Oct. 20, 1998, now Pat. No. 6,300,785.

(51) Int. Cl.[7] .................. H01L 31/042; H01L 31/05
(52) U.S. Cl. .................. 136/244; 136/249; 136/258; 136/291; 136/293; 257/452; 257/461; 257/465; 257/466; 257/443; 257/446; 257/459
(58) Field of Search ................ 136/244, 249, 136/258, 291, 293; 257/452, 461, 465, 466, 443, 446, 459

(56) References Cited

U.S. PATENT DOCUMENTS

| | | | |
|---|---|---|---|
| 1,342,885 A | 6/1920 | Armstrong | |
| 4,122,396 A | 10/1978 | Grazier et al. | |
| 4,184,894 A | * 1/1980 | Lindmayer et al. | ......... 136/249 |
| 4,820,916 A | 4/1989 | Patriquin | |
| 4,829,238 A | 5/1989 | Goulette et al. | |
| 4,959,603 A | 9/1990 | Yamamoto et al. | |
| 4,963,729 A | 10/1990 | Spillman et al. | |
| D315,561 S | 3/1991 | Miller | |
| 5,006,788 A | 4/1991 | Goulette et al. | |
| 5,028,866 A | 7/1991 | Wiese | |
| 5,095,267 A | 3/1992 | Merrill et al. | |
| 5,218,294 A | 6/1993 | Soiferman | |
| 5,459,402 A | 10/1995 | Ueno et al. | |
| 5,551,065 A | 8/1996 | Honore | |
| 5,581,094 A | * 12/1996 | Hara et al. | ..................... 257/80 |
| 5,631,572 A | 5/1997 | Sheen et al. | |
| 6,040,592 A | * 3/2000 | McDaniel et al. | ......... 257/292 |
| 6,300,785 B1 | * 10/2001 | Cook et al. | ................. 324/765 |

* cited by examiner

*Primary Examiner*—Alan Diamond
(74) *Attorney, Agent, or Firm*—McGinn & Gibb, PLLC; Mark F. Chadurjian, Esq.

(57) ABSTRACT

A device, having circuits formed thereon, comprises a circuit including a frequency generator for generating a detectable radio frequency energy when powered and a power generator, coupled to the frequency generator, for generating power when exposed to light.

10 Claims, 6 Drawing Sheets

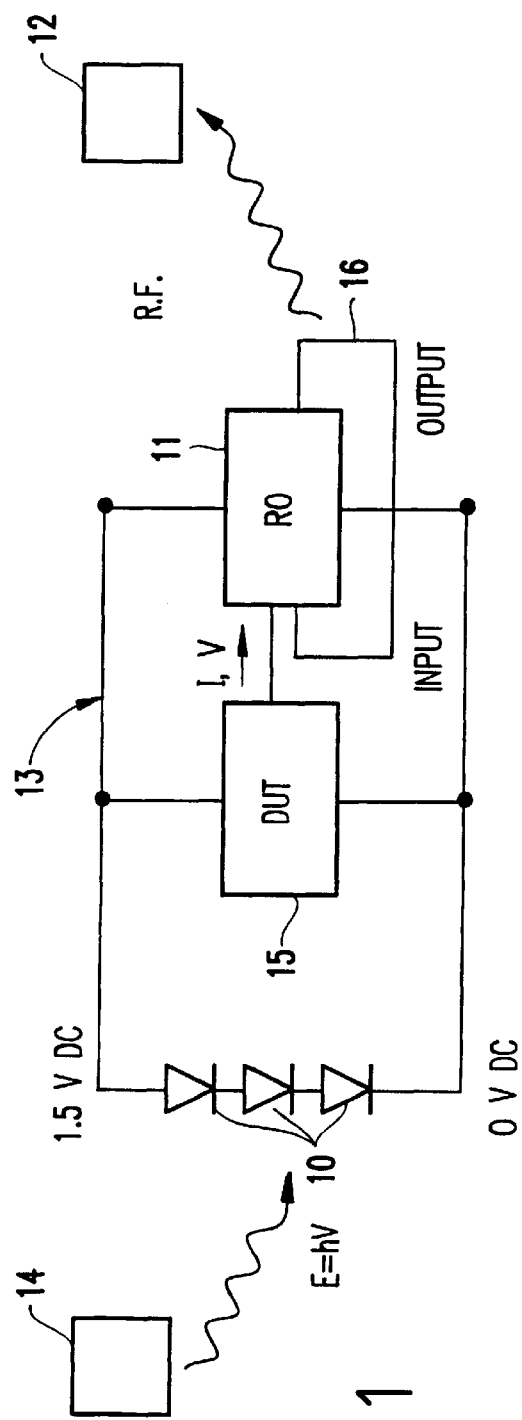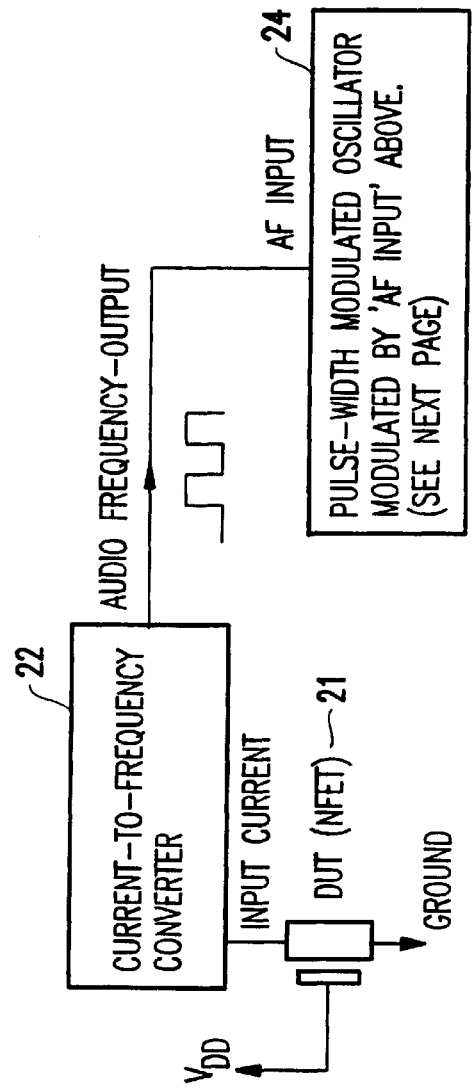
FIG.1
FIG.2A

CONTACT-LESS PROBE OF SEMICONDUCTOR WAFERS

CROSS-REFERENCE TO RELATED APPLICATIONS

This application is a division of U.S. application Ser. No. 09/175,303 filed Oct. 20, 1998 now U.S. Pat. No. 6,300,785.

BACKGROUND OF THE INVENTION

1. Field of the Invention

The present invention generally relates to devices for testing semiconductor wafers during manufacturing and, more specifically, to testing devices which do not contact the device under test (DUT).

2. Description of the Related Art

During the manufacturing of semiconductor devices and wafers, unwanted defects occasionally occur. In order to reduce such defects and increase production yield it is desirable to test the item being manufactured at various points during the manufacturing process.

Conventional systems remove the item being manufactured from the production line at different fabrication steps and test the item for defects. Depending on the development needs, a semiconductor wafers could be pulled at the post-silicide polysilicon stage, during the local interconnect stage or at several of the metalization stages, such as post metal-1 anneal, post via-1 planarization, or post metal-2 etch, for testing.

Conventional testing systems come in physical contact with the item being manufactured. Specifically, most conventional systems connect test pins to contacts on the wafer being manufactured to determine whether the electrical connections formed on the wafer are operating properly.

Some conventional devices measure the electromagnetic near field distribution adjacent to the device under test. Such systems require a physical connection to supply power to the device under test.

By making physical contact with the item being manufactured, the conventional systems introduce foreign materials in the production line, which increases the chance of defects being produced in subsequent processing steps and, therefore, reduces overall yield for the manufacturing process.

SUMMARY OF THE INVENTION

It is, therefore, an object of the present invention to provide a structure and method to determine important device parameters and in-line yield parameters (such as device channel length and metal defects), without physically probing the wafers. The invention includes a light powered generator, a radio frequency generator, a radio frequency receiver, a charge transfer circuit and a light source to power the device under test (DUT).

More specifically, the inventive device has circuits formed thereon, and comprises a circuit including a frequency generator for generating a detectable radio frequency energy when powered, and a power generator, coupled to the frequency generator, for generating power when exposed to light.

The radio frequency energy comprises detectable characteristics correlating to a level of processing quality of the device. The frequency generator comprises a ring oscillator. The power generator comprises a plurality of diodes. The plurality of diodes are each formed in a separate well and coupled in series for generating voltage when exposed to light. The power generator includes an antenna. The antenna comprises signal wiring connected to the power generator.

The invention also includes a current amplifying device connected to the power generator. The current amplifying device comprises a capacitor connected to the power generator and is charged by the power generator, a transistor for controlling the capacitor, and a second series of diodes for activating the transistor when exposed to light.

The power generator comprises a power generating circuit comprising a substrate, a plurality of diodes each formed in a separate well in the substrate and A coupled in series for generating voltage when exposed to light and an opaque layer overlapping at least a border formed by the well and the substrate for preventing activating a parasitic diode when exposed to the light.

The invention also includes a system for testing semiconductor chips comprising a circuit including a frequency generator for generating a detectable radio frequency energy when powered, a power generator, coupled to the frequency generator, for generating power when exposed to light, an optical device for generating the light, a receiver for detecting the radio frequency energy, and an analyzer connected to the receiver for analyzing the radio frequency energy.

BRIEF DESCRIPTION OF THE DRAWINGS

The foregoing and other objects, aspects and advantages will be better understood from the following detailed description of preferred embodiments of the invention with reference to the drawings, in which:

FIG. 1 is a schematic diagram of a circuit according to the invention;

FIG. 2A is schematic diagram of a device under test for NFET drain current according to the invention;

DETAILED DESCRIPTION OF PREFERRED EMBODIMENTS OF THE INVENTION

Figure 2B:
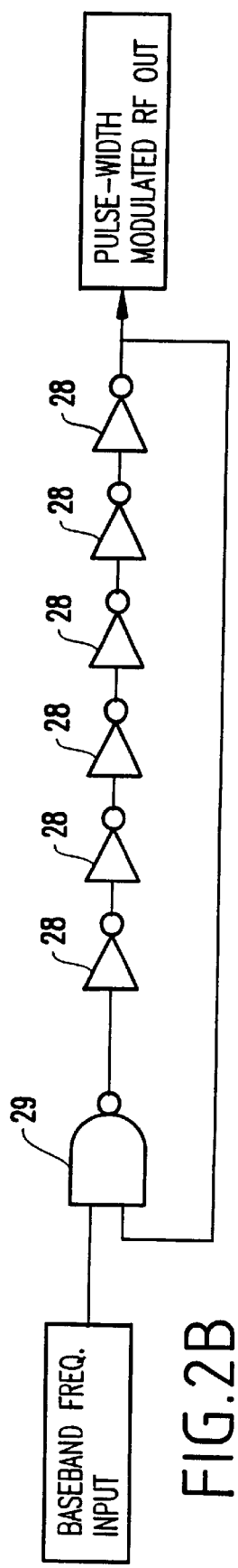
FIG. 2B is a schematic diagram of a pulse-width-modulated ring oscillator according to the invention.

Referring now to the drawings, and more particularly to FIG. 1, a contact-less probe is illustrated. As mentioned above, the present invention provides a structure and method for determining important device parameters and in-line yield parameters (such as device channel length and metal defects), without physically probing (contacting) the item being manufactured.

The invention includes a light powered generator 10, a radio frequency generator 11, a radio frequency receiver 12, a charge transfer circuit 13 and a light source 14 to power the device under test (DUT) 15, as shown in FIG. 1.

When the DUT 15 is powered by the charge transfer circuit 13, the DUT 15 will send a voltage or current to the radio frequency generator 11 (e.g., ring oscillator). Depending on the DUT output, the radio frequency generator 11 output frequency will vary accordingly.

A radio frequency generator is one of the most versatile process and device monitors. For example, a radio frequency generator can be used to extract parameters such as device performance and silicide resistance. More specifically, the stage delay of an inverter ring oscillator designed with minimum length and narrow width MOSFETs will have a frequency which is dependent strongly on device performance and, thus, the frequency of operation can provide a measure of MOSFET performance. A second, similarly designed, inverter oscillator with very wide gates will additionally exhibit significant sensitivity to silicide resistance on the gate electrodes. Thus, a comparison of the frequency of operation of this oscillator with that of the former can afford a measure of silicide resistance.

Since the radio frequency generator generates radio frequencies (RF), its output frequency can be obtained without contact via the RF receiver 12. The RF receiver 12 also includes an analyzing unit which analyzes the signals received from the radio frequency generator 11.

The invention is superior to conventional contact-less measurement in that with the invention, the radio-frequency characteristics can be varied in a multitude of ways to convey detailed information about the wafer processing. Some examples of characteristics which can be varied include modulation of the frequency of the oscillator itself in proportion to a process or device parameter or modulation of the oscillator with pulses whose width or frequency signal carries process information (e.g., audio-frequency amplitude modulation of the radio-frequency oscillator). Thus, the invention is applicable to most any parameter capable of being monitored electrically.

For example, the frequency of the RF oscillator can be varied in a manner dependent on the leakage between two metal lines, by arranging for the magnitude of the leakage to vary the charging rate of a known capacitance which in turn is used to frequency-modulate the RF oscillator. Comparison of this oscillator with a reference allows a measure of this leakage. The frequency variation can then be detected by the RF receiver and this information used to determine the presence (or absence) of defects between the metal lines. The threshold of leakage considered a defect is chosen as appropriate since the inventive modulation can be designed to accommodate the desired sensitivity. To the contrary, conventional near field detection structures suffer from inflexibility to a variety of measurements and sensitivities.

The radio frequency generator output is connected to a long metal wire 16 which naturally acts as an antenna to broadcast the radio frequency signals. Alternatively, a fixed or other form of antenna could be used, depending upon each given application. In general, the modulation signals can preferably include amplitude modulation (AM), frequency modulation (FM) or pulse code modulation (PCM).

Figure 2C:
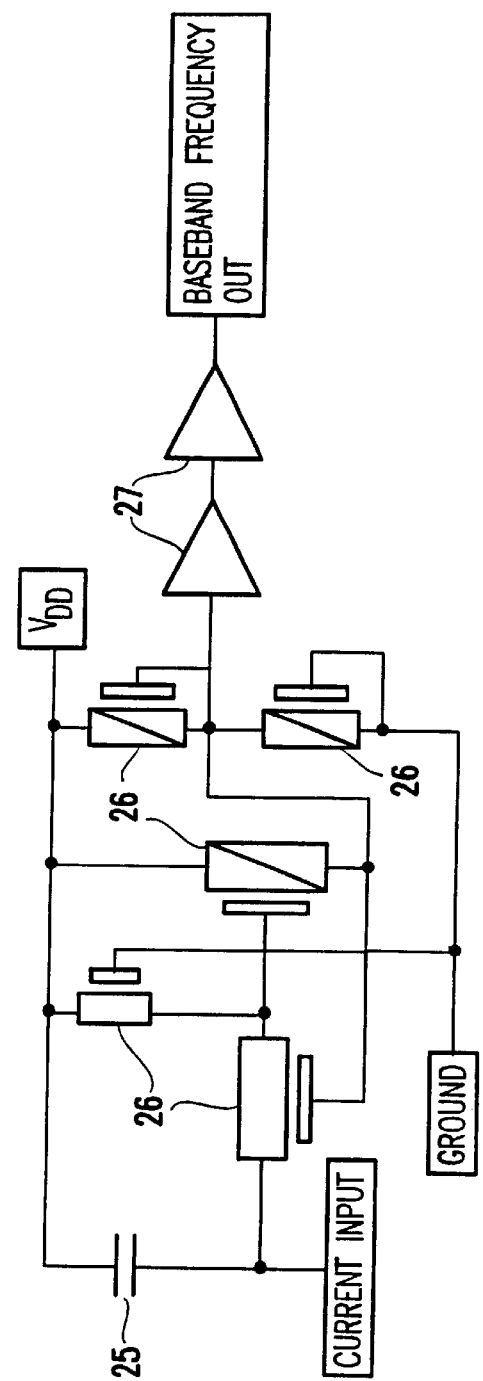
FIG. 2C is a schematic diagram of a current-to-frequency converter according to the invention.

In many cases, the DUT can include the radio frequency generator itself as shown in FIGS. 2A–2D. For example, FIG. 2A illustrates an N-type MOSFET 21 drain-current structure implemented as the device under test. The current drawn by the NFET 21, discharges a capacitor 25 within a current-to-frequency converter 22 (which is shown in more detail in FIG. 2C), until a Schmitt trigger (comprising transistors 26) fires to recharge the capacitor 25. This forms a relaxation oscillator whose frequency is proportional to the drain current of the DUT 21. Two inverters 27 are used to saturate the voltage output into a square wave with a baseband frequency proportional to the DUT drain current, as shown in FIG. 2C.

FIG. 2B more specifically illustrates the pulse-width modulated oscillator 24 and shows a ring oscillator, that includes a series of inverters 28 and a NAND circuit 29, which is pulse-width modulated by a signal provided by the current-to-frequency converter. The ring oscillator will oscillate with (radio) frequency approximately equal to $1/(n \times T)$ where n is the number of stages (n=7 in FIG. 2B) when the input is at Vdd and will stop oscillating as long as the input is at 0V. Thus, the radio frequency generated by this ring oscillator will be pulse-width modulated by the input (baseband) frequency.

Figure 2D:
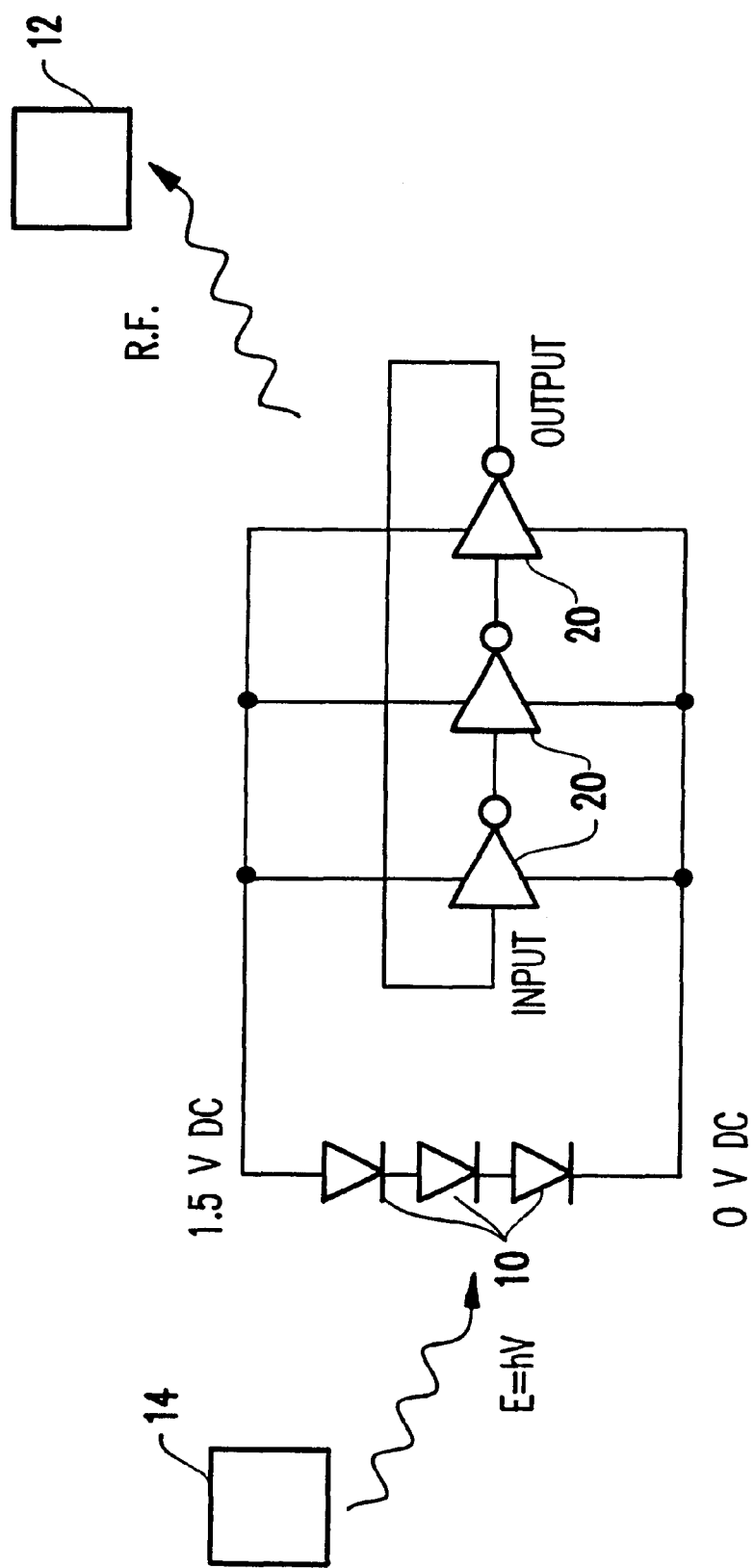
FIG. 2D is a schematic diagram of a circuit according to the invention.

The layout of the serially connected "power source" diodes 20 is shown in FIG. 2D. A bigger power source (e.g., depending upon the diode size and the number of diodes) is required as the DUT draws more power. The inventive radio frequency generator is designed to draw very little power through proper selection of device widths and lengths. It is also designed to operate at a relatively low voltage. Preferably, the metal oxide semiconductor field effect transistors (MOSFETs) in the inventive radio frequency generator would be designed with a minimum-allowed channel length and width (e.g. in 0.25 μm complementary metal oxide semiconductor (CMOS), the design lengths and widths may be 0.25 μm and 0.3 μm, respectively).

For example, many common radio frequency generators operate at 1.5 V, which is about the voltage generated by three optically-illuminated diodes. By optimizing the layout of the three-diode stack, the invention provides enough power to drive a radio frequency generator with just a microscope light.

Figure 3A:
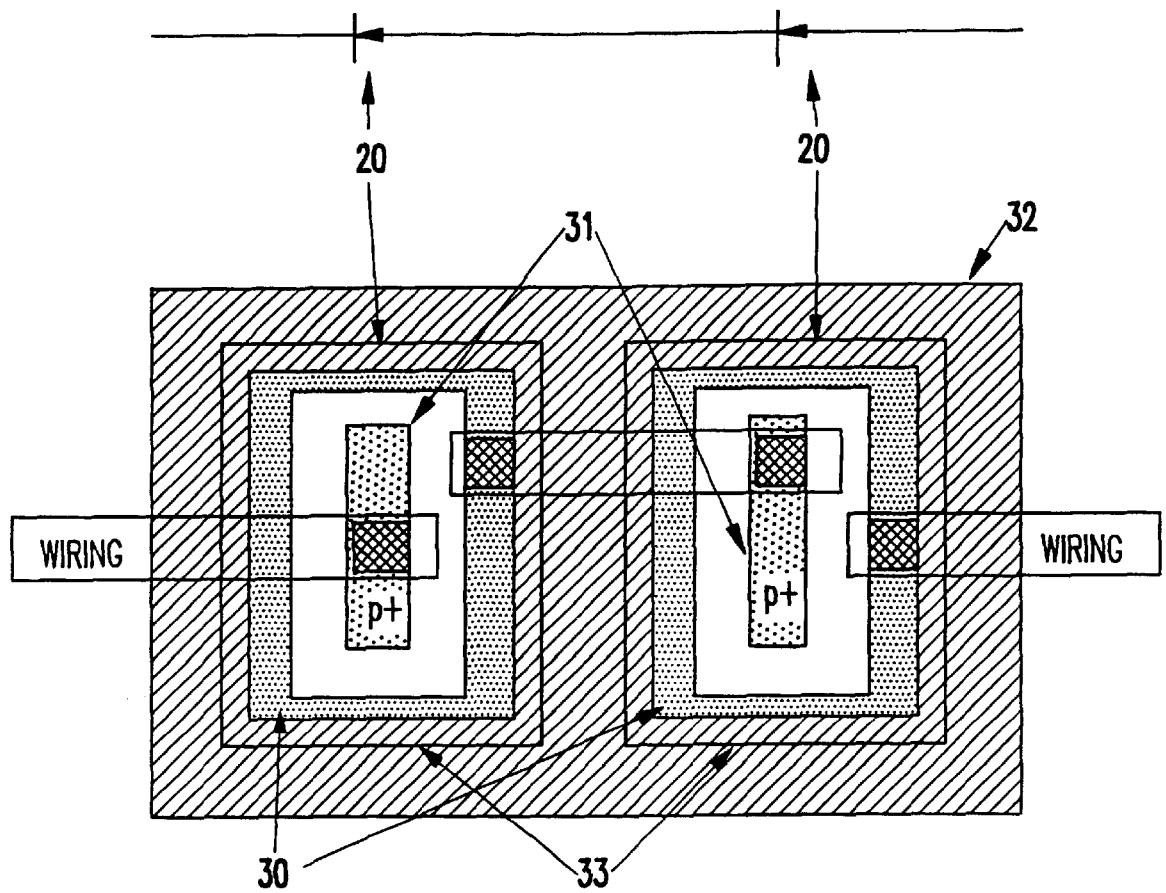
FIG. 3A is a schematic diagram of a diode layout according to the invention.

FIG. 3A illustrates an equivalent structure for the diodes 20, which are preferably p-n diodes having $p^+$ diffusions 31 inside an N-well 33 and a light shield (e.g., an opaque layer) 32. The construction of such diodes typically begins with, selectively etching shallow trenches into regions of a p-type silicon wafer followed by an oxide deposition and subsequent planarization by etch-back or chemical-mechanical polish. This is followed by implantation of N-Well regions through openings in a patterned resist. Within the N-Well regions a mask is used to define alternate heavily doped n-type regions and a second mask is used to dope the remaining heavily doped p-type regions. The $n^+$ regions serve as a contact to the N-well regions and form the cathode of the pn diode. The $p^+$ regions serve as the anode of the diode.

The diodes 20 are laid out in an enclosed form to maximize the collection efficiency. The enclosed design enhances the probability that optically generated carriers between the $n^+$ and $p^+$ diode terminals are collected by those terminals and, thus, provides the best efficiency.

As illustrated in FIG. 3A, a metal (or polysilicon) light shield 32 is used to keep light from shorting out the diodes. Without such a light-blocking layer, the same light source which illuminates the power-generating p-n diodes would also illuminate the n-well to p-substrate junction 30. This junction 30 would then generate a voltage in direct opposition to the desired voltage, thereby canceling the desired electrical isolation of the n-well 33 from the substrate.

The layout dimensions of the structure illustrated in FIG. 3A are carefully chosen depending on the semiconductor properties of each given technology (e.g. doping concentrations). It is important that the diode areas are optimized due to the space constraint of the kerf (i.e., the test-structure area within the dicing channel region around product structures).

Figure 3B:
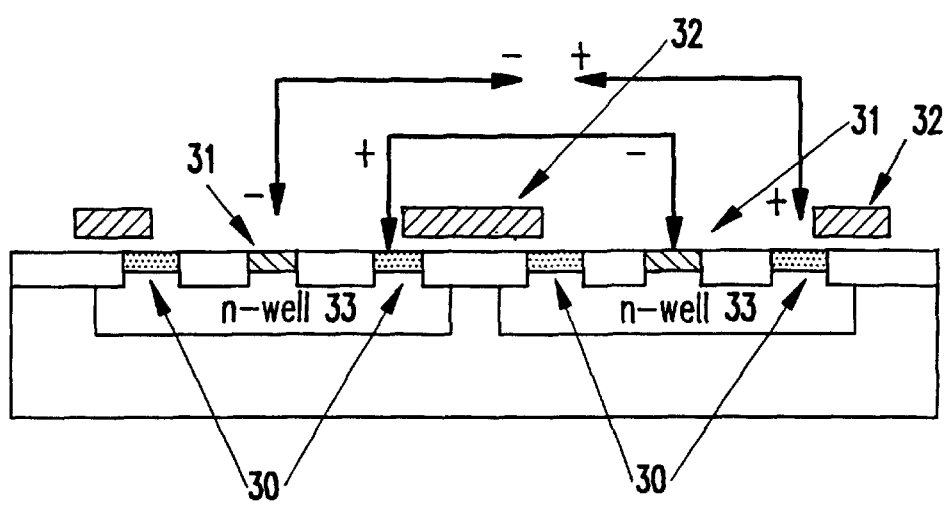
FIG. 3B is a schematic diagram of a diode layout according to the invention.

FIG. 3B shows a cross-sectional view of the structure shown in FIG. 3A. The n-well/p-substrate areas 30 are covered by polysilicon metal plates or other common opaque materials 32 to prevent light from generating large numbers of electron-hole pairs near the n-well/substrate junctions 30, while allowing light to enter the p+ areas 31 in the n-well regions, where such generation is desirable. Thus, voltage is developed across the p+ 31 to n-well 33 area, while isolation of the n-well to the p-substrate junction 30 is maintained.

Figure 4:
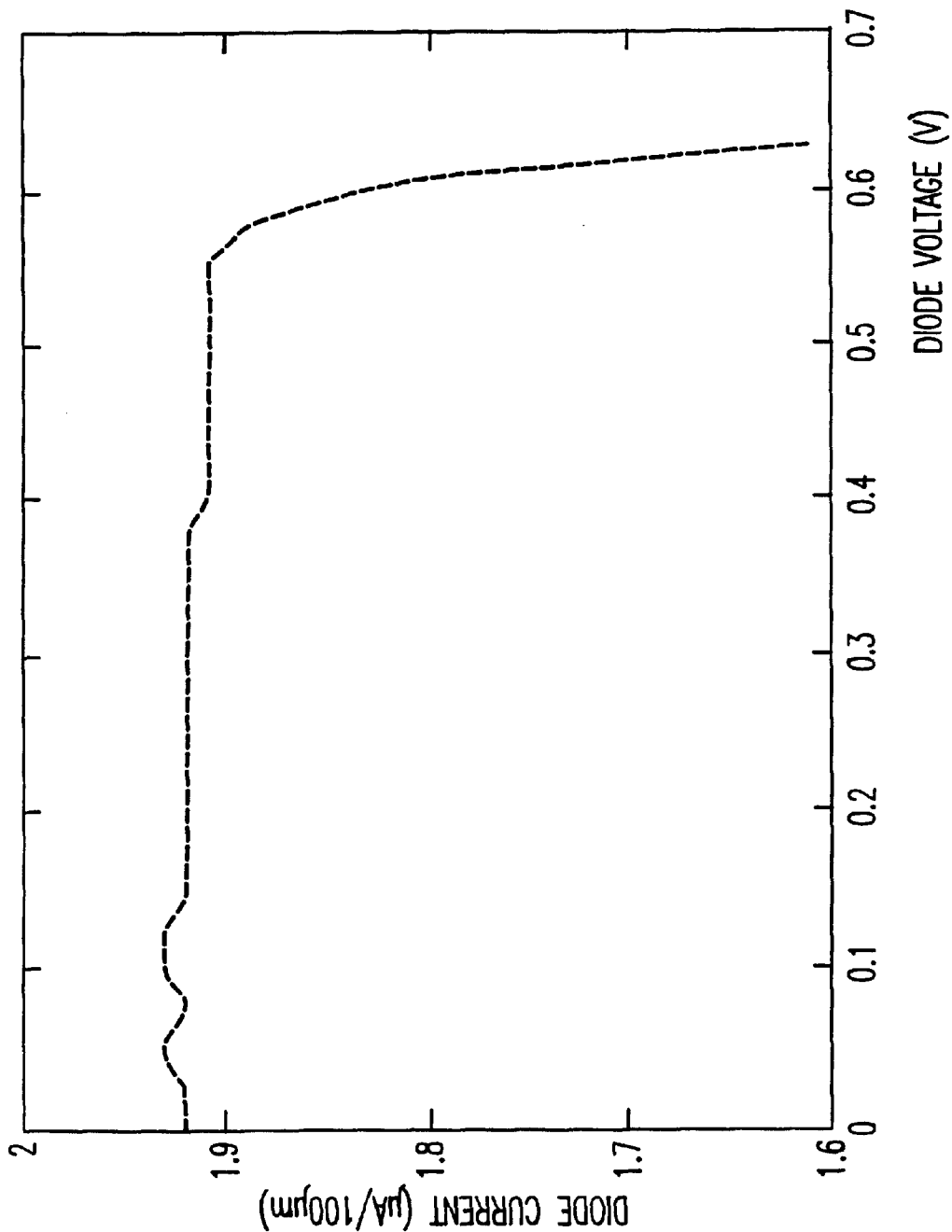
FIG. 4, is a graph illustrating the advantages of the invention.

The inventive diode produces sufficient power as shown in FIG. 4. More specifically, FIG. 4 illustrates the diode current on the y-axis and the diode voltage on the x-axis. FIG. 4 illustrates a very consistent current until the voltage reaches an excessive value.

A p+/n-well diode was used for illustration purposes in FIG. 4. Even if such a diode was not optimized for collection efficiency, it could produce nearly 20 nA/um from an ordinary microscope light.

Figure 5:
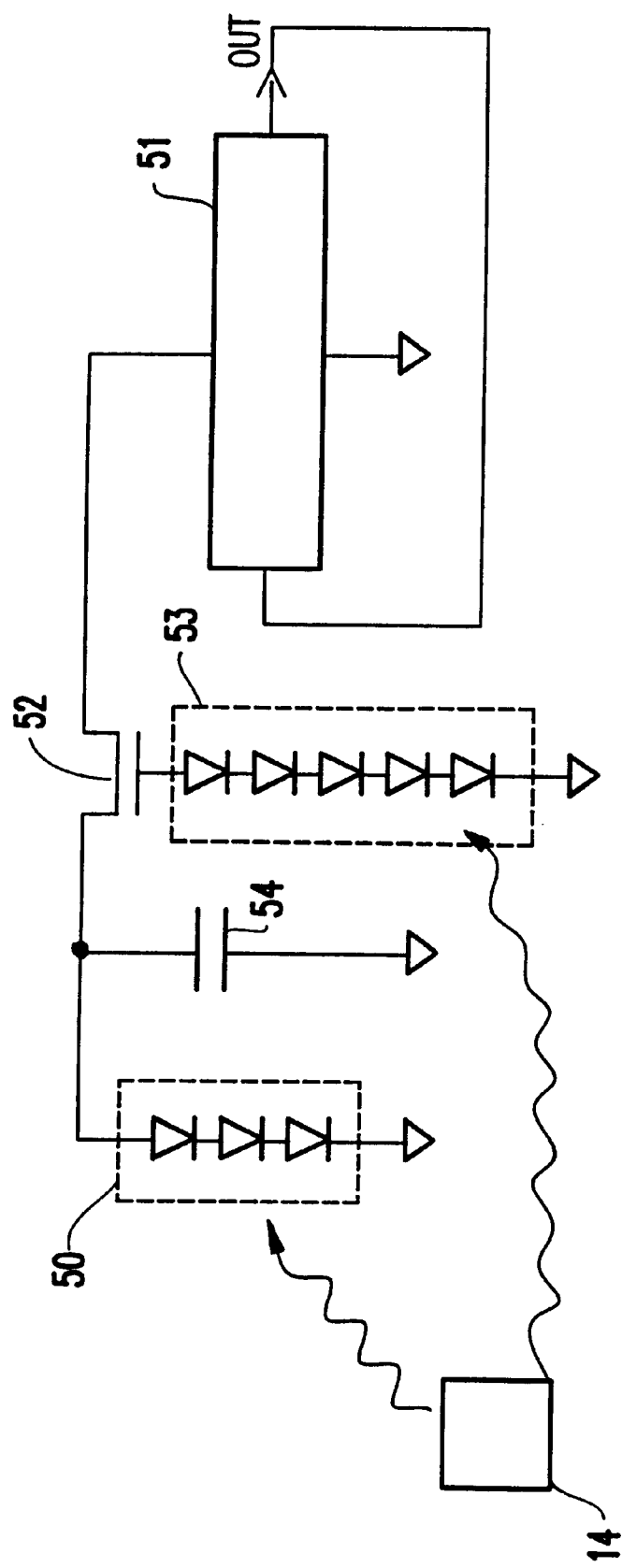
FIG. 5 is a schematic diagram of a circuit according to the invention.

If more power is necessary, the inventive charge-transfer structure shown in FIG. 5 can be utilized. More specifically, FIG. 5 illustrates three stacked diodes 50 which comprise a "power source". The stacked diodes 50 do not drive the high power radio frequency generator 51 directly. Instead, the diodes 50 are connected to the radio frequency generator 51 via an N-type field effect transistor (NFET) switch 52. The gate of the NFET 52 is connected to five stacked diodes 53.

At first, the light source is directed to the "power source" diode stack 50 to charge up a large storage capacitor 54. Once the capacitor is fully charged, the light is also shone on the five-diode stack 53 to activate the NFET 52. The radio frequency generator 51 is then powered by the capacitor 54 and oscillates to output the desired RF signal.

As would be known by one ordinarily skilled in the art given the foregoing disclosure, this invention can be extended to any environment where physical contact to provide power and/or return signals is either not possible or is undesirable. In such environments, an optical power source, such as a laser, could provide the energy which is converted by p-n junctions into electrical power for the operation of signaling instrumentation. The signaling instrumentation would then modulate an onboard radio-frequency generator to provides return information about the state of the system.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A power generating circuit comprising:
   a substrate;
   a plurality of diodes each formed in a separate well in said substrate and coupled in series for generating voltage when exposed to light; and
   an opaque layer overlapping at least a border formed by said well and said substrate for preventing activating a parasitic diode when exposed to said light.

2. The power generating circuit as in claim 1, further comprising a current amplifying device connected to said power generator.

3. The power generating circuit as in claim 2, wherein said current amplifying device comprises:
   a capacitor connected to said power generator and for being charged by said power generator;
   a transistor for controlling said capacitor;
   a second series of diodes for activating said transistor when exposed to light.

4. A power generating circuit, comprising:
   a plurality of well regions of a second conductivity type disposed in a substrate of a first conductivity type and forming a junction therewith;
   diffusion regions of said first and second conductivity types disposed in each of said plurality of well regions, a diffusion region of the first conductivity type in each of said plurality of well regions forming a diode within a respective one of said plurality of well regions;
   a layer disposed on the substrate that inhibits activation of a parasitic diode at said junction when the circuit is exposed to light; and
   electrical interconnections between selected ones of said plurality of diffusion regions in different ones of said plurality of well regions, forming a series connection between plural ones of the diodes in said different ones of said plurality of well regions.

5. The power generating circuit as in claim 4, wherein said diffusion region of the first conductivity type in each of said plurality of well regions is a p+ type region, and wherein remaining ones of said diffusion regions in said plurality of well regions are p+ regions.

6. The power generating circuit as in claim 5, wherein said layer is comprised of an opaque material.

7. The power generating circuit as in claim 6, wherein said opaque material comprises polysilicon.

8. The power generating circuit as in claim 6, further comprising a plurality of isolation regions between adjacent ones of said plurality of well regions.

9. The power generating circuit as in claim 8, wherein said opaque material is disposed on at least some of said plurality of isolation regions.

10. The power generating circuit as in claim 8, further comprising a plurality of isolation regions between adjacent ones of said plurality of diffusion regions.

* * * * *